(12) United States Patent
Stayt, Jr. et al.

(10) Patent No.: US 6,389,046 B1
(45) Date of Patent: May 14, 2002

(54) METHOD TO SENSE LASER ARRAY POWER AND WAVELENGTH AND REDUCE DRIFT FOR WAVELENGTH SELECTION AND STABILIZATION

(75) Inventors: John W. Stayt, Jr., Schnecksville; James K. Plourde, Allentown; Scott L. Broutin, Kutztown, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/290,307

(22) Filed: Apr. 12, 1999

(51) Int. Cl.[7] .................................................. H01S 3/13
(52) U.S. Cl. ........................ 372/29.02; 372/29.011; 372/38.1; 372/38.01; 372/38.02; 372/34; 356/454; 356/460; 356/506; 356/450
(58) Field of Search ...................... 372/32, 29.02, 372/34, 36, 38.1, 38.01, 38.02, 29.011, 26; 356/452, 454, 460, 506

(56) References Cited

U.S. PATENT DOCUMENTS

| | | |
|---|---|---|
| 5,706,301 A | 1/1998 | Lagerstrom |
| 5,793,784 A | 8/1998 | Wagshul et al. |
| 6,198,757 B1 * | 3/2001 | Broutin et al. ................. 372/32 |

* cited by examiner

*Primary Examiner*—Frank G. Font
*Assistant Examiner*—Armando Rodriguez (57) ABSTRACT

The output of a dedicated control laser element in a laser array, which closely tracks the output of the array, is directed to a discriminator and feedback control means through a closed loop feedback-based system to provide both wavelength stability and power control of the array without reducing the optical power output from the array. The output of a dedicated control laser element in a laser array is also directed to a discriminator and synchronous detection means and is frequency modulated with a local oscillator to reduce the electronic drift and stabilize the wavelength of the dedicated laser source.

40 Claims, 4 Drawing Sheets

METHOD TO SENSE LASER ARRAY POWER AND WAVELENGTH AND REDUCE DRIFT FOR WAVELENGTH SELECTION AND STABILIZATION

BACKGROUND OF THE INVENTION

1. Field of Invention

The present invention relates generally to optoelectronics and laser technology, and more specifically to methods employed in industrial and communication applications using a control laser element and laser array source for sensing and stabilizing laser array power and wavelength, without reducing array output power (i.e. lossless), and reducing drift in a wavelength stabilized laser source.

2. Description of the Prior Art

Wavelength stability in the optical output signal of the light source is necessary in many sensor systems and telecommunication systems using optical fibers. Depending upon the system, a high precision of wavelength stability, in parts per million, is required. Similarly, a high degree of stabilization is also necessary in the lasers used in fiber optic telecommunication systems. Further limiting the influence of noise and drift in these sensitive systems would enable additional traffic utilization in these systems.

Communication service providers are experiencing significant consumer demands to accommodate additional bandwidth in optically-based communications systems and the demand is ever-increasing. Today's optical communication systems and networks field rising consumer demands for e-mail, video, multimedia, data and voice-data transmission requirements across a variety of communication protocols. In the future, all indications are that the use of fiber optic networks will become even more prevalent as a preferred medium for transferring information as the marketplace for wide-band services matures. It is anticipated that additional services such as enhanced pay-per-view, video-on-demand, interactive television and gaming, image networking, video telephony, CATV, and ISDN switching services will be dependent on and be substantial to users of such systems.

Devices representative of existing technology for implementing fiber optic networks, which are known in the industry, include waveguide division multiplexers (WDMs), fiber amplifiers such as erbium doped fiber amplifiers (EDFAs), and add/drop networks. These devices, as well as other components of a fiber optic network, contribute to or are affected by power level variances in the independent channels of a fiber optic network and may also contribute to noise and drift in the system. Therefore, the maturation of economically feasible and technically satisfactory fiber optic networks for the multiple users and diverse uses previously described, is dependent upon the stabilization of power levels in the independent channels of a fiber optic network, the reduction of wavelength spacing between adjacent channels, and the reduction of drift in a stabilized optical source.

Lasers are employed in numerous applications, particularly within fiber optic networks. Often, due to constraints in design or by way of limitations of devices in the system, it is important to stabilize and control the laser output wavelength, i.e. locking the wavelength to a reference wavelength. Similarly, because a single semiconductor laser may not generate sufficient power for the system, high power semiconductor laser sources such as semiconductor laser arrays, generating high optical power, are utilized. These high power laser arrays are made of single stripes of semiconductor lasers and may also be stacked to form two dimensional laser arrays. As is often the practice, each element of a laser array may be of a different wavelength than another element. Controlling and stabilizing the wavelength and output of the arrays, while minimizing losses to or splitting of the output power is critical to system performance.

In particular, in a wavelength division multiplex communication system, there typically exists a high number of independent channels in a transmission line. These channels are independent of each other and are well-suited for multimedia and multi-data transmission and communication. Wavelength division multiplexed (WDM) communication systems have further advanced to dense wavelength division multiplexed (DWDM) systems, the DWDM systems being point-to-point systems designed to increase the capacity of installed fiber. DWDM systems currently provide up to 400 GBps capacities and beyond over a single strand of fiber, and provide transmission capabilities four to eight times those of traditional time division multiplexed (TDM) systems. DWDM systems require 0.1–20 ppm frequency stabilization over their anticipated life spans which are estimated at 25 years.

A DWDM system typically includes at least one optical amplifier having two key elements: an optical fiber that is doped with the element erbium and the amplifier. Typically a laser is employed to energize the erbium with light at a specific wavelength and the erbium thereby acts as a gain medium that amplifies the incoming optical signal. The gain of the optical amplifier is dependent upon the optical power in the signal channel. The strength of the incoming signal is desired to be optimal. If the power of the optical signal is degraded, as may occur due to phase modulations, the signal may be insufficient to meet demands of the communication system, often due to too little power resulting in not enough gain from the amplifier.

In a WDM and DWDM communication systems, many channels can be secured by narrowing the channel gaps and transmitting the signals in the same tunable range for each channel. In order to keep the gaps smaller than a change in width due to drift of wavelength of a semiconductor laser, control is necessary to reduce the influence of the drift of wavelength. In order to reduce the influence of drift of wavelength it is necessary to stabilize the wavelength absolutely or relatively.

The wavelength of light emitted from a laser source varies as a function of the operating temperature, and of the current applied to the energy source for excitation. Controlling the wavelength output in an optical multichannel system with narrow channel spacing is further complicated by the fact that laser output wavelength is influenced by other factors such as acoustic vibrations as an example.

Critical to these systems is the ability to reduce wavelength spacing between adjacent channels, and thereby increase the number of channels available to be utilized within any particular waveband. Employing a method for wavelength stabilization is necessary to compensate for the effects of temperature and current variation to obtain a reasonable degree of stabilization. Employing a method for wavelength stabilization without reducing power of the optical light sources, for a plurality of optical light sources, is also desired. Employing a method which utilizes high power optic sources and has a means for stabilizing the wavelength of the source, without dramatically reducing the output of the source, is especially desired.

A number of light source stabilization approaches are known for application to discrete laser devices. The following three patent applications referred to following are hereby incorporated by reference into the present application. For example, U.S. Pat. No. 4,842,358 discloses optical signal source stabilization using an interferometer forming optical beams through a birefringent crystal interferometer, wherein the beams have similar intensities at a desired source frequency. The difference between the intensities of each beam generates an error signal which is directed to a means for altering the drive current of the source to produce an optical output signal which minimizes the error signal.

U.S. Pat. No. 5,167,444 discloses optical signal source stabilization, wherein the optical output signal from the source is stabilized by adjusting its frequency to maintain a selected optical transmission through a Fabry-Perot interferometer. The interferometer has a "split-level" gap whereby the gap is split into two discrete portion of different widths. A photodetector associated with each portion generates an electric signal indicative of the beam intensity or power transmitted through that portion of the gap. At a desired wavelength of the optical signal incident in the interferometers, the transmission of the light through the gap will be approximately equal in both gap portions, resulting in substantially equal amplitudes of the electrical signals from the two photodetectors. The two photodetectors' signals are then fed into a drive current of the optical source so as to minimize the amplitude error signal. This minimum error will occur at the desired wavelength.

U.S. Pat. No. 5,428,700 discloses the stabilization of a wavelength of a light source by introducing a collimated beam from the source into a Fabry-Perot cavity having a continuously decreasing width along at least one axis that is normal to the axis of beam propagation. Photodetectors at the output side of the etalon produce signals which are employed in a feedback loop, whereby the wavelength of the light source is controlled to minimize the amplitude difference between the photodetector output signals.

Similarly, other methods, known in the art, employ variations of the splitting of discrete laser light output whereby laser light may be split prior to an optical fiber, or laser light is split from the back side of the laser, between the discriminator and the photodetector used for power control. Each of the known approaches have certain limitations. U.S. Pat. No. 4,842,358 requires relatively expensive components such as birefringent crystals made to precisely controlled tolerances. U.S. Pat. No. 5,167,444 is relatively difficult to adapt to multiple light source applications, such as arrays. U.S. Pat. No. 5,428,700 splits the power from the laser package output fiber and send a portion of the light to the wavelength discriminator thereby reducing the output of the laser light by 5–10% or more. Splitting laser light from the back side of the laser further reduces an already low power source, as the back side of a typical communications laser is generally 5%–25% of the power of the front side, and may further limit the available output power causing an inability to control the laser optical power output and wavelength. Further, each of the prior art systems discloses wavelength stabilization techniques for discrete laser sources which are insufficient for certain communication systems demanding higher power optic sources or bundled light sources for higher output power.

The optical amplification in fiber links is a necessity in long-haul communication systems using optical fibers, and also in distribution systems involving large numbers of subscribers. Optical amplifiers enable the optical power in a fiber path to be maintained at sufficiently high levels such that the signal-to-noise ratio (SNR) degradation due to signal shot noise and receiver noise is nearly inconsequential. However, the optical amplifier introduces a dominant noise source to such systems. This dominant noise source, being amplified spontaneous emission (ASE), occurs when the amplifiers are operated at "true" direct current (e.g. microhertz to hertz ranges) and is inversely related to the frequency. Similarly, drift of the electronics and the drift of the laser directly impact performance of the optical systems as longer integration times are required to accurately extract signals from the drift and noise components. It is therefore desirable to filter out noise and drift factors related to the wavelength and system electronics in a communication system.

As reducing output power and utilizing discrete lasers is contrary to the rising communication systems demands, there remains an unsatisfied need for a system of high power light source wavelength stabilization that is more easily and economically fabricated than the prior art systems, which also possesses a convenient and ample output power and wavelength source for achieving future communication demands.

The subjects of the present invention provide methods for stabilizing the output wavelength of an optical laser source, and for reducing the drift in a wavelength stabilized laser source.

SUMMARY OF THE INVENTION

It is an object of the present invention to provide a method for stabilizing, to a stability generally in the range of 0.1 ppm to 20 ppm, or better, the wavelength of an array of optical output signals from an optical source array, using a control laser element of the array, wherein the present invention comprises a discriminator, through which a pair of optical beams from the source are propagated; photodetection means for generating an electrical signal in response to each of the beams propagated through the discriminator; a temperature sensing means, for monitoring the temperature of the control laser element; a temperature controlling means, for adjusting the temperature of the control laser element to change the resulting output wavelength; and controlling means for (a) generating an error signal in response to the difference in amplitudes of the two electrical signals generated by the photodetection means, and (b) feeding the error signal to the optical source through the temperature controller to control the output wavelength of the control laser element so as to minimize the amplitude of the error signal.

It is another object of the present invention to provide a method for reducing drift in a wavelength stabilized laser source by frequency modulating with an alternating current a dedicated element of the laser array and filtering noise through a synchronous detection system, having a phase-sensitive detection means.

It is a further object of the present invention to provide a method for utilizing a high power laser diode driver array, comprised of semiconductor or solid-state laser elements, as an optic source for stabilizing the wavelength without reducing output power of the array.

It is still a further object of the present invention to provide a method which can be effectively employed with laser arrays having many individual laser elements, with at least one dedicated laser element of the array generating the optical source to the discriminator.

It is another object of the present invention to provide such a method which is efficient and inexpensive.

As will be more readily appreciated from the detailed description that follows, the present invention offers a number of advantages not previously achieved in the prior art. For example, the present invention offers both wavelength and power stabilization, with the ability to reduce drift in a wavelength stabilized source, in an efficient and inexpensive manner.

These and other objects, features and advantages of the present invention will become apparent from the following detailed description of illustrative embodiments thereof, which is to be read in connection with accompanying drawings.

DETAILED DESCRIPTION OF THE INVENTION

Figure 1:
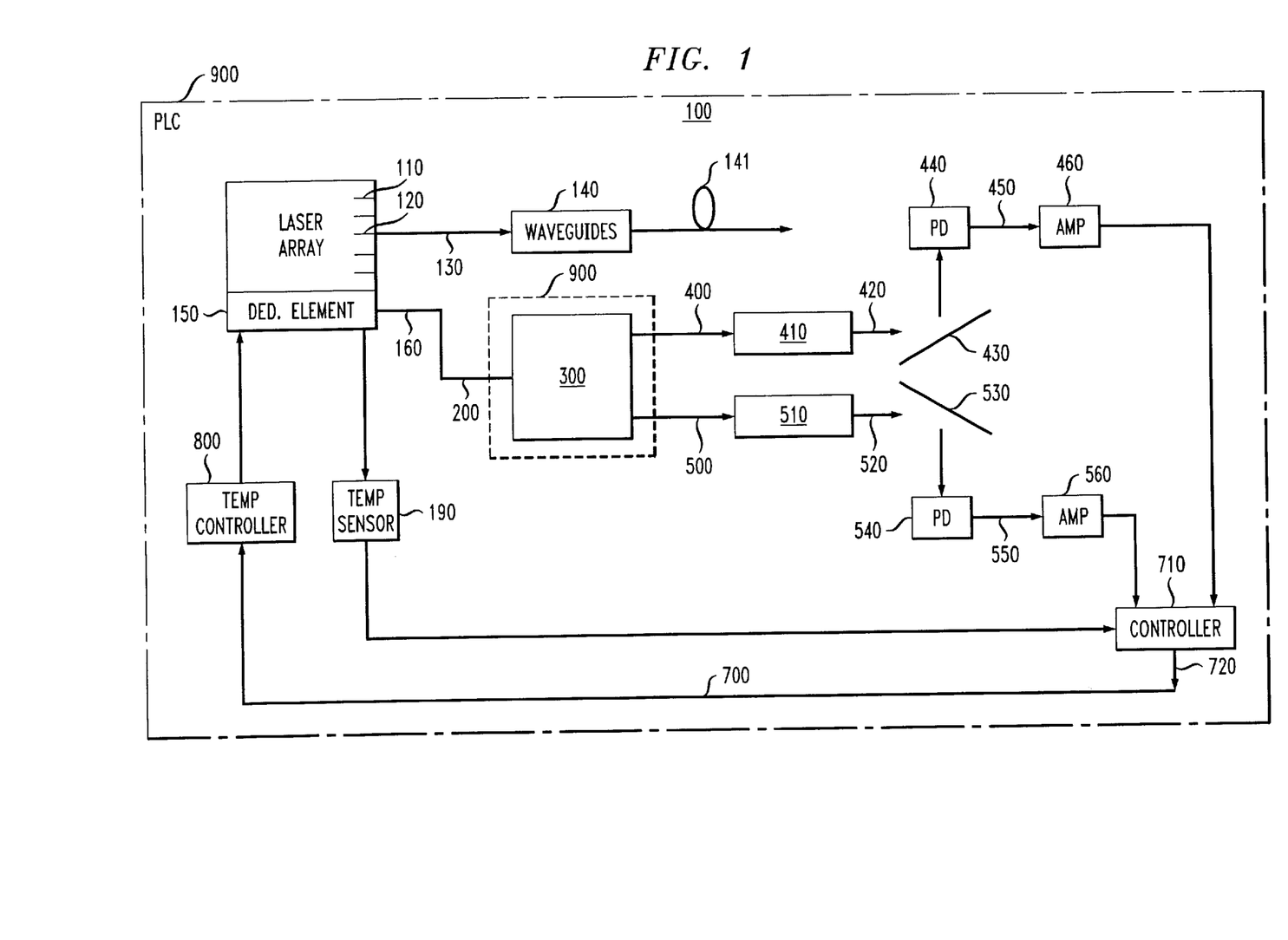
FIG. 1 is a schematic diagram of a system for laser wavelength and power stabilization, in accordance with a preferred embodiment of the present invention.

FIG. 1 illustrates a stabilization of the optical output of a light source in accordance with a preferred embodiment of the present invention. The light source 100 in applications of interest will be an array 110 of semiconductor lasers or solid state lasers, and will be referred to hereinafter as an "array". The array 110 is comprised of a plurality of lasers 120 which are adaptively fabricated such that each of the laser elements in the array exhibit characteristics which may be similar to other elements or which may be different intentionally. The laser elements independently output light sources in a range of wavelengths, wherein in a preferred embodiment, the output light 130 from the laser array is propagated through waveguides 140. Output from the waveguides 140 is preferably directed along a fiber optic path 141. Within the array 110, at least one of the lasers, known hereafter as a dedicated element of the array, is a control laser element 150 which has an output 160 representative of the output of the entire array 130. The control laser element 150 is preferably fabricated to track and generate an output light source 160 representative of the power and wavelength of the entire array. Preferably, the laser is a distributed feedback laser (DFB). The laser, by way of example and not of limitation, may also be a DBR laser, a high-power or a low-power laser. The control laser element 150 outputs a light source 160 at a predetermined power and wavelength. The temperature of the control laser element 150 is monitored at predetermined intervals through the temperature sensor 190. The temperature of the control laser array 150, as monitored by the temperature sensor 190, is directed to a controller 710 for evaluation.

The light source 160 is emitted from the control laser element 150. The emitted beam 200 is then directed as an optical input signal to the input side of a discriminator 300, which may preferably be an interferometer of the etalon or Mach-Zender or Fabry-Perot type, a high-pass filter, a low-pass filter, a band-pass filter, or an interference filter. Additionally, the discriminator 300 may be integrated onto the Planar Lightwave Circuit (PLC) 900. The discriminator 300 generates a pair of ideally equi-power optical beams 400, 500. Then, advantageously but not necessarily, each of the two beams 400, 500 may then be directed into one of a pair of collimating lenses 410, 510 to produce a pair of substantially parallel, collimated light beams 420, 520.

Emergent beams from the interferometer are preferably but not necessarily first respectively reflected off adjustable turning mirrors 430, 530 which may be preferably etched into the PLC 900 which houses the array 110. The emergent beams are then detected by a matched pair of photodetectors 440, 540, which may be conventional photodiodes. In another embodiment of the present invention, the photodetectors 440, 450 are cofabricated as a single unit. Each of the photodetectors detects one of the two emergent optical beams and generates an electrical signal 450, 550 indicative of the amplitude of the respective emergent beam, wherein the amplitude is a function of wavelength and power for the non-reference path having optical beam 400. The reference path emergent beam amplitude is a function only of power. The electrical output signal of each of the photodetectors is inputted into a conventional amplifier 460, 560. The amplifier amplifies the inputted electrical signal from the photodetectors, increasing the SNR of each of the signals. The amplified electrical signals outputted from each amplifier are then inputted into a closed feedback loop 700, along with temperature data of the control laser element 151 from the temperature sensor 190, wherein the feedback loop 700 has a controller 710, which evaluates differences in the input signals and produces a control signal 720 indicative of valuation differences between the two amplified electrical signals. The control signal is communicated to the temperature controller 800 through the closed feedback loop 700, wherein the temperature controller adjusts the control laser element 150 to output 160 at the desired wavelength. Optionally, the feedback loop 700 may comprise a microprocessor, Application Specific I.C. (ASIC), field programmable gate array (FPGA), digital signal processor (DSP), digital circuits and analog circuits, by way of example and not of limitation.

Figure 2:
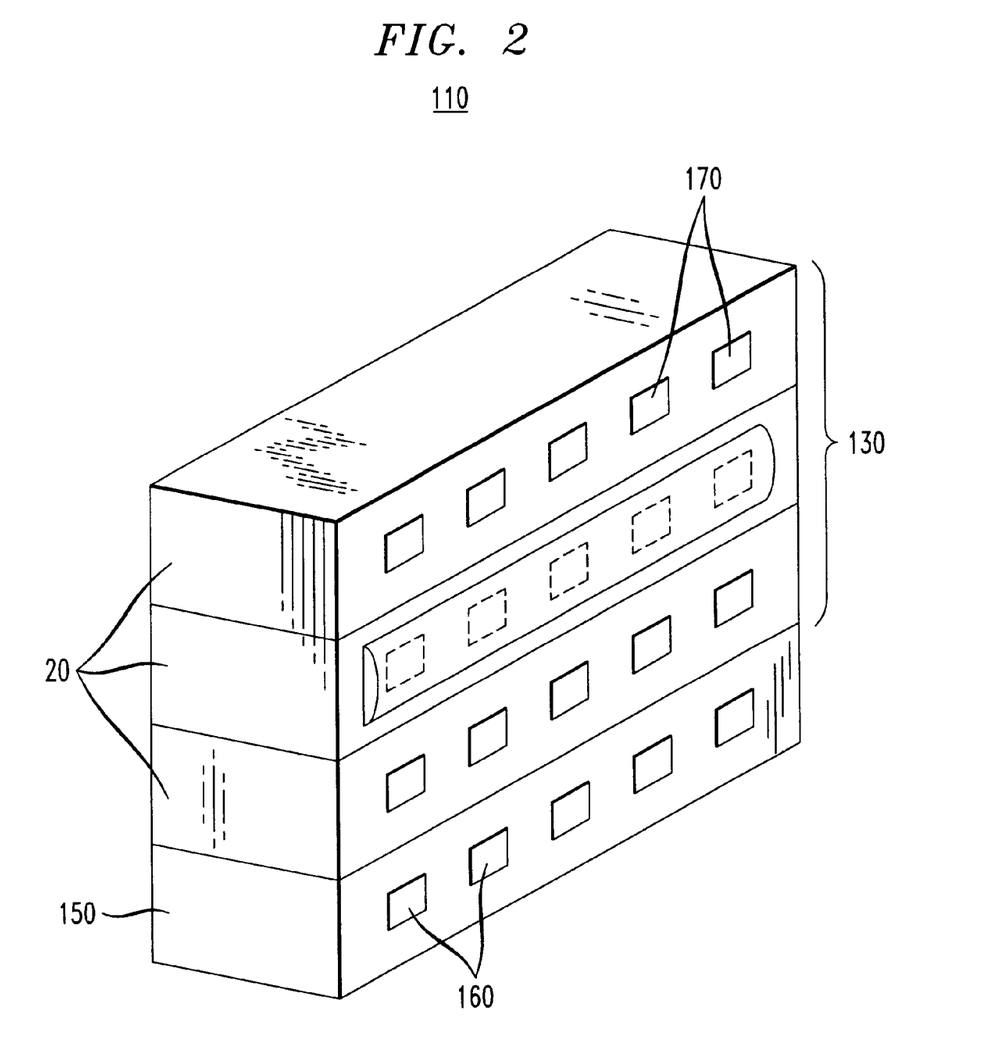
FIG. 2 is an enlarged perspective view of a diode laser array which may be employed in the method of the present invention.

FIG. 2 illustrates details of a diode laser array 110. The array is comprised of a plurality of laser elements 120, each of which includes a number of individual output facets 170, where it is to be understood that any convenient number of laser elements 120 and output facets 170. The array has a control laser element 150 which has an output 160 that may be separated from the output of the rest of the array 130 as a dedicated optical source.

Figure 3:
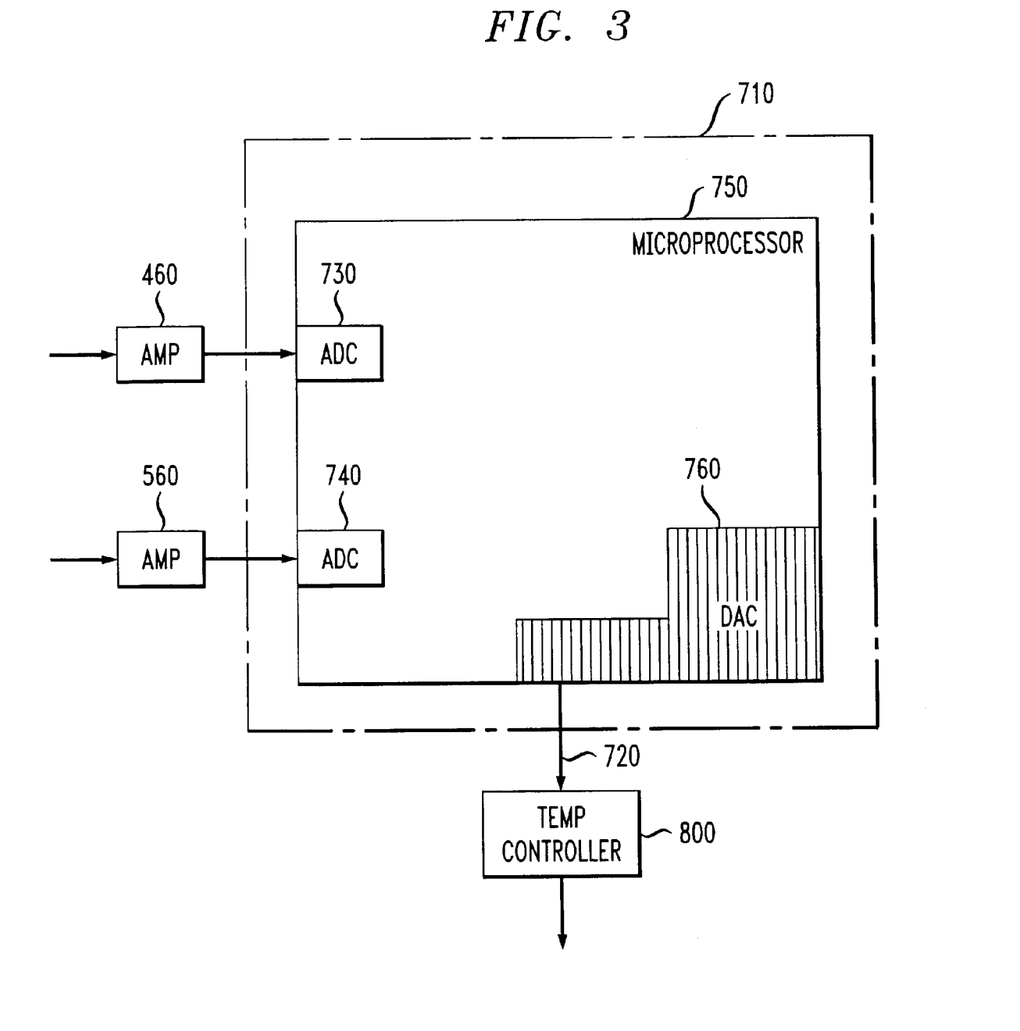
FIG. 3 is a schematic diagram of a variation of the controller, in accordance with a preferred embodiment of the present invention.

In FIG. 3, detail of a preferred embodiment of controller of the present invention is depicted. The controller 710 may preferably be comprised of a pair of analog-to-digital converters (ADC) 730, 740 and a microprocessor 750 having a digital-to-analog converter (DAC) 760. Optionally, the ADCs 730, 740 and the DAC 760 are integrated with the microprocessor 750. The output signals from the amplifiers are applied directly to the respective ADCs. The microprocessor 750 then generates a digital version of the control signal 720. The control signal is then converted to analog through the DAC 760 for communication to the temperature controller 800. Advantageously but not necessarily, other variations to the controller 710 are herein incorporated including the use of active embedded software, a software-based control signal generating device, a differential amplifier, and similar. Further variations of the present invention which are beneficial may also include microprocessor-based iterative and algorithmic evaluations of the control signal with collected control laser element temperature data.

Figure 4:
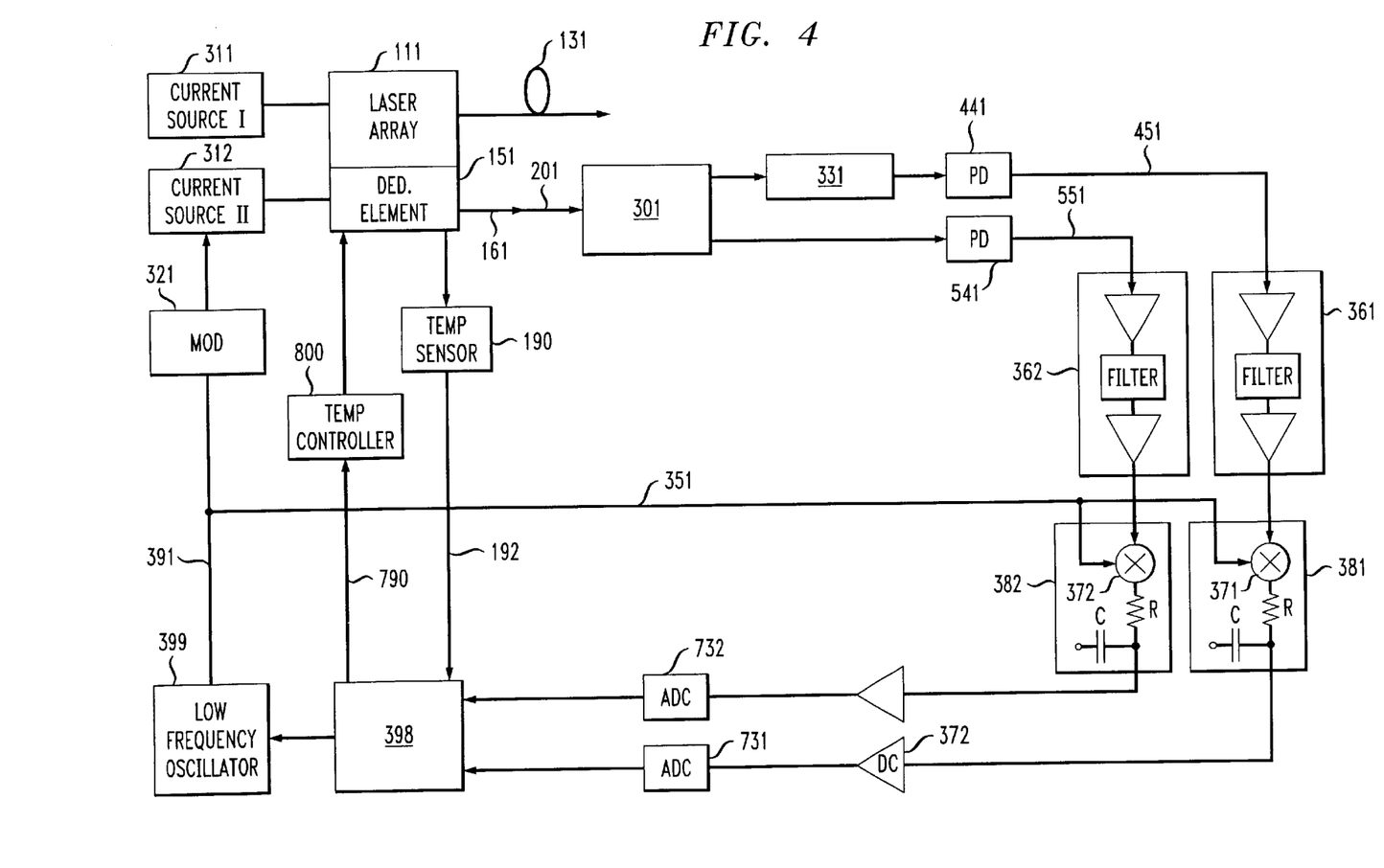
FIG. 4 is a schematic diagram for of a system for reducing drift in a wavelength stabilized laser source, in accordance with a preferred embodiment of the present invention.

FIG. 4 is a schematic diagram of a system for reducing drift in a wavelength stabilized laser source. The direct current source 311 is used to drive the laser array 111 to generate sources of optical output to a fiber optic path 131. A second current source 312 having both alternating and direct current is used to drive the control laser element 151. The current source 312 has a direct current (dc) component which energizes the control laser element 151, and an alternating current (ac) component which is controlled by a modulation controller 321. The modulation controller 321 modulates the optical frequency of the signal delivered by the control laser element 151. Optionally, the ac component further modulates the laser array 111. The control laser element output 161 is emitted from the control laser element 151 wherein the emitted beam 201 is directed as an optical input signal to a discriminator 301. The discriminator 301 may be an interferometer of the etalon or Mach-Zender or Fabry-Perot type, a high-pass filter, a low-pass filter, a band-pass filter, or an interference filter, which generates a pair of optical beams of equal wavelength. Advantageously but not necessarily, a wavelength selecting filter 331 may be used along the non-reference path to selectively filter the optical signal from the discriminator 301 and thusly improve wavelength stabilization. The output signals from the discriminator 301 are detected by a pair of photodetectors 441, 541, which may be conventional photodiodes or which may be cofabricated photodetectors. Each of the photodetectors detects one of the two emergent optical beams from the discriminator and generates an electrical signal 451, 551. The electrical signal output of the one photodetectors 451 of the non-reference path is passed through an ac coupled amplifier-filter-amplifier combination 361, and is mixed with a dithering signal 351 from the local oscillator 399, generated at a particular dither frequency, at a mixer 371 within a phase sensitive detector (PSD) 381. The electrical signal out of a second photodetector 551, of the reference path, is passed through an ac coupled amplifier-filter-amplifier combination 362, and is mixed with a dithering signal 351 from the local oscillator 399, generated at a particular N dither frequency, at a mixer 372 within a phase sensitive detector (PSD) 382.

The non-reference path PSD 381, a synchronous detection system, is used to provide a control DC output voltage, as a DC signal, that is linearly proportional to the amplitude and phase modulation at a predetermined frequency, f. The combination of the photodetectors and the PSDs perform optical to electrical conversion of the sampled optical pulses and outputs electrical signals. The PSD has very low bandwidth (on the order of 1 Hz), filters the drift and out-of-band noise terms and generates SNR of the order of 1:1000. In the PSD, only signals at or near a predetermined frequency or one of the harmonics of the predetermined frequency is detected. The PSD is preferably further comprises a low pass filter. The output from the local oscillator 399 is directed to the PSD 381. The local oscillator 399 generates an output signal 391 which is directed to the modulating controller 321 for coupling. The local oscillator may be comprised of either a microcontroller or an analog circuit. Preferably, the DC signal from the PSD is inputted to an amplifier 373 which is further inputted to an ADC 731 to produce binary or another digital output type signal representative of the value of the DC signal. Similarly, output from the local oscillator 399 is directed to the reference path PSD 382. DC output from the reference path PSD 382 is inputted to an ADC 732 and the ADC output is inputted to the microcontroller 398. The output from the ADC is input to a microcontroller 398 adapted to provide a pulse width modulator output signal in relation to the received digitally converted DC signal. The modulated output is communicated to the modulation controller 321 for modulation of the ac current. Output signals 790 are directed to the Temperature Controller 800 which adaptably adjusts and controls the temperature of the control laser element 151. The temperature of the control laser element is monitored by the temperature sensor 190, which preferably is a thermistor, and a temperature signal 192 is fed back to the microcontroller 398.

What is claimed is:

1. A method for sensing and stabilizing power of a laser array and controlling wavelength while optimizing power output of the laser array, wherein the laser array has a power source and comprises a plurality of single laser elements, wherein each laser element comprises a front side and a back side, comprising:
  a) emitting a control optical source from at least one predetermined laser element of the laser array, wherein output of the control optical source of the predetermined laser element approximates output of the laser array;
  b) directing output of the control optical source from the predetermined laser element to a discriminator as optical source input;
  c) generating a driving signal from the discriminator;
  d) directing the driving signal from the discriminator as input to a feedback system,
  e) generating an error signal from the feedback system;
  f) directing the error signal from the feedback system as input to a temperature controller for the predetermined laser element, whereby output of the control optical source is stabilized.

2. The method of claim 1, wherein the feedback system comprises a pair of turning mirrors, a pair of photodetectors and an error control means.

3. The method of claim 2, wherein the laser array, the discriminator and the feedback system are fabricated to be in a planar lightwave circuit (PLC).

4. The method of claim 1, wherein the discriminator is an interferometer.

5. The method of claim 4, wherein the discriminator is a Mach-Zender interferometer.

6. The method of claim 4, wherein the discriminator is a Fabry-Perot interferometer.

7. The method of claim 1, wherein the discriminator is an interference filter.

8. The method of claim 1, wherein the discriminator is a low-pass filter.

9. The method of claim 1, wherein the discriminator is a high-pass filter.

10. The method of claim 1, wherein the discriminator is a band-pass filter.

11. The method of claim 1, wherein the laser array has a laser array power source comprising a direct current power source.

12. The method of claim 11, wherein the laser array has a laser array power source comprising a high-power source.

13. The method of claim 1, wherein the laser elements of the laser array are adaptively arranged on a substrate to be in close proximity to each other.

14. The method of claim 13, wherein the laser array is a solid state laser array.

15. The method of claim 13, wherein the laser array is a semiconductor laser array.

16. The method of claim 1, wherein the predetermined laser element is either a distributed feedback (DFB) laser source or a distributed Bragg reflector (DBR) laser source.

17. The method of claim 1, wherein at least one element of the laser array has a wavelength of a value different from another element of the array.

18. The method of claim 1, wherein a plurality of elements of the laser array have wavelengths of values different from other elements of the array.

19. The method of claim 1, wherein the control optical source output is generated from the front side of at least one of the predetermined laser elements.

20. The method of claim 1, wherein the control optical source output is generated from the back side of at least one of the predetermined laser elements.

21. The method of claim 19, wherein the control optical source output is generated from the front sides of more than one of the predetermined laser elements by splitting a portion of the output of each of the outputs of the predetermined laser elements.

22. The method of claim 20, wherein the control optical source output is generated from the back sides of more than one of the predetermined laser elements by splitting a portion of the output of each of the outputs of the predetermined laser elements.

23. The method of claim 1, wherein the feedback system is comprised of a microprocessor-based means.

24. The method of claim 23, wherein the feedback system is comprised of embedded software.

25. A method for reducing drift in a wavelength stabilized laser array source, wherein the laser array has a power source and comprises a plurality of single laser elements,
wherein each laser element comprises a front side and a back side, by frequency modulating the power source from output of a local oscillator, comprising:
a) emitting a control optical source from at least one predetermined laser element of the laser array, wherein output of the control optical source of the predetermined laser element approximates output of the laser array;
b) directing output of the control optical source from the predetermined laser element to a discriminator as optical source input;
c) generating a driving signal from the discriminator;
d) directing the driving signal from the discriminator as input to a phase sensitive detection means, whereby drift is filtered from the driving signal;
e) generating a current signal from the phase sensitive detection system;
f) directing the current signal from the phase sensitive detection system to a local oscillator; and
g) frequency modulating the power source of the predetermined laser element.

26. The method of claim 25, wherein the frequency modulating is performed by applying an alternating current from the local oscillator.

27. The method of claim 25, wherein the phase sensitive detection means is comprised of a signal mixing means and phase detection circuitry having a high signal-to-noise ratio (SNR), to synchronously detect the driving signal at a predetermined frequency.

28. The method of claim 27, wherein a dithering signal is mixed with the driving signal, whereby the SNR is increased by synchronous detection.

29. The method of claim 25, wherein the local oscillator is comprised of an analog-to-digital converter (ADC) and a converting means.

30. The method of claim 28, wherein the converting means is a microcontroller.

31. The method of claim 30, wherein the output of the microcontroller is a pulse width signal.

32. The method of claim 29, wherein the converting means is an analog circuit.

33. The method of claim 27, wherein the phase sensitive detection system is software.

34. The method of claim 25, wherein the phase sensitive detection system is a direct current path whereby the direct current path is utilized when SNR is sufficiently high.

35. A method for sensing and stabilizing power of a laser array and controlling wavelength while optimizing power output of the laser array, wherein said laser array has a power source and comprises a plurality of laser elements, and wherein each of said laser elements comprises a front side and a back side, said method comprising the steps of:
a) emitting a control optical source from at least one predetermined laser element of said laser array, wherein an output of said control optical source of said predetermined laser element approximates output of said laser array;
b) directing said output of said control optical source from said predetermined laser element to a discriminator as optical source input;
c) generating a driving signal from said discriminator;
d) directing said driving signal from said discriminator as input to a feedback system comprising a pair of turning mirrors, a pair of photodetectors, and an error control means;
e) generating an error signal from said feedback system;
f) directing said error signal back from said feedback system as input to a temperature controller for said predetermined laser element whereby output of said optical source is stabilized.

36. The method of claim 35, wherein said laser array, said discriminator, and said feedback system are fabricated to be in a planer lightwave circuit (PLC).

37. A method for sensing and stabilizing power of a laser array and controlling wavelength while optimizing power output of said laser array, said laser array having a power source and comprising a plurality of single laser elements, wherein each of said laser element comprises a front side and back side and wherein at least one element of said laser array has a wavelength of a value different from another element of the array, said method comprising the steps of:
a) emitting a control optical source from at least one predetermined laser element of said laser array, where an output of said control optical source of said predetermined laser element approximates output of the laser array;
b) directing said output of the control optical source from said predetermined laser element to a discriminator as optical source input;
c) generating a driving signal from said discriminator;
d) directing said driving signal from said discriminator as input to a feedback system;
e) generating an error signal from the feedback system;
f) directing said error signal back from said feedback system as input to a temperature controller for said predetermined laser element whereby output of said optical source is stabilized.

38. A method for sensing and stabilizing power of a laser array and controlling wavelength while optimizing power output of said laser array, said laser array having a power source and comprising a plurality of single laser elements, wherein each said laser element comprises a front side and a back side, and wherein a plurality of said elements of said laser array have wavelengths of values different from other elements of said array, said method comprising the steps of:

a) emitting a control optical source from at least one predetermined laser element of said laser array, where an output of said control optical source of said predetermined laser element approximates output of the laser array;

b) directing output of said control optical source from said predetermined laser element to a discriminator as optical source input;

c) generating a driving signal from said discriminator;

d) directing said driving signal from said discriminator as input to a feedback system;

e) generating an error signal from said feedback system;

f) directing said error signal back from said feedback system as input to a temperature controller for said predetermined laser element whereby output of said optical source is stabilized.

39. A method for sensing and stabilizing power of a laser array controlling wavelength while optimizing power output of said laser array, said laser array having a power source and comprising a plurality of single laser elements, wherein each of said laser element comprises a front side and a back side, said method comprising the steps of:

a) emitting a control optical source generated from a plurality of predetermined laser elements of said laser array by splitting a portion of the output from each of the outputs of said predetermined laser elements, wherein output of said control optical source approximates output of said laser array;

b) directing said output of said control optical source from said predetermined laser element to a discriminator as optical source input;

c) generating a driving signal from said discriminator;

d) directing said driving signal from said discriminator as input to a feedback system;

e) generating an error signal from said feedback system;

f) directing said error signal back from said feedback system as input to a temperature controller for said predetermined laser element whereby output of said optical source is stabilized.

40. A method for sensing and stabilizing power of a laser array controlling wavelength while optimizing power output of said laser array, said laser array having a power source and comprising a plurality of single laser elements, wherein each of said laser element comprises a back side and a back side, said method comprising the steps of:

a) emitting a control optical source generated from a plurality of predetermined laser elements of said laser array by splitting a portion of the output from each of the outputs of said predetermined laser elements, wherein output of said control optical source approximates output of said laser array;

b) directing said output of said control optical source from said predetermined laser element to a discriminator as optical source input;

c) generating a driving signal from said discriminator;

d) directing said driving signal from said discriminator as input to a feedback system;

e) generating an error signal from said feedback system;

f) directing said error signal back from said feedback system as input to a temperature controller for said predetermined laser element whereby output of said optical source is stabilized.

* * * * *